United States Patent
Yokota et al.

(10) Patent No.: US 6,818,727 B2
(45) Date of Patent: Nov. 16, 2004

(54) HIGHLY PURIFIED EPOXY RESIN

(75) Inventors: Akira Yokota, Ibaraki (JP); Nobuyuki Nakajima, Ibaraki (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/320,719

(22) Filed: May 27, 1999

(65) Prior Publication Data

US 2002/0177683 A1 Nov. 28, 2002

(30) Foreign Application Priority Data

May 29, 1998 (JP) .......................................... 10-149703

(51) Int. Cl.$^7$ ............................................... C08G 59/00
(52) U.S. Cl. .......................... 528/99; 549/551; 549/552
(58) Field of Search ............................ 528/99; 549/551, 549/552

(56) References Cited

U.S. PATENT DOCUMENTS

| | | | |
|---|---|---|---|
| 2,951,825 A | * 9/1960 | Reinking et al. | ............. 528/99 |
| 4,447,598 A | 5/1984 | Caskey et al. | |
| 4,487,948 A | 12/1984 | Shimp et al. | |
| 4,542,202 A | * 9/1985 | Takeuchi et al. | ............ 549/551 |
| 4,831,101 A | 5/1989 | Jellinek et al. | |
| 4,900,848 A | 2/1990 | Saito et al. | |
| 4,957,995 A | 9/1990 | Saito et al. | |
| 5,017,674 A | * 5/1991 | Tada et al. | ..................... 528/99 |
| 5,449,737 A | * 9/1995 | Uchida et al. | ................ 528/73 |
| 5,545,697 A | 8/1996 | Uchida | |

FOREIGN PATENT DOCUMENTS

EP            0 193 068 A1     9/1986

* cited by examiner

*Primary Examiner*—Philip C. Tucker
(74) *Attorney, Agent, or Firm*—Fitch, Even, Tabin & Flannery

(57) ABSTRACT

Provided is an epoxy resin having glycidylamino group, wherein the content of hydrolyzable chlorine is 1000 ppm or less. The epoxy resin is useful for adhesives, paints and electric/electronic materials(e.g. insulation materials, laminated plate, etc.).

3 Claims, No Drawings

HIGHLY PURIFIED EPOXY RESIN

BACKGROUND OF THE INVENTION

1. Field of the Invention

The present invention relates to an epoxy resin containing low content of hydrolyzable chlorine, which is useful for adhesives, paints and electric/electronic materials(e.g. insulation materials, laminated plate, etc.).

2. Description of the Related Art

It is indispensable for epoxy resins used for electric/electronic materials that the content of hydrolyzable chlorine is low. As for typical epoxy resins, such as bisphenol A type, bisphenol F type, and orthocresol novolak type epoxy resin, purification has been conducted, and epoxy resins containing hydrolyzable chlorine of 500 ppm or less, and in a specially purified case, those containing hydrolyzable chlorine of about 200 ppm have been developed.

However, as for epoxy resins having glycidylamino group, especially aminophenol type epoxy resins such as 4-amino-m-cresol type and 4-aminophenol type epoxy resins, it has been rarely used for an electric/electronic material, and because of difficulty of the preparation, epoxy resins of high purity have not been developed, and the hydrolyzable chlorine content has been usually 1000 ppm or more.

An object of the present invention is to provide an epoxy resin of low hydrolyzable chlorine content, which is highly reliable in the use for adhesives, paints and electric/electronic materials (e.g. insulation materials, laminated plate, etc.).

SUMMARY OF THE INVENTION

The present invention is as follows.

(1) An epoxy resin having glycidylamino group, wherein the content of hydrolyzable chlorine as an impurity is 1000 ppm or less.
(2) The epoxy resin according to (1), wherein the epoxy resin having glycidylamino group is an aminophenol type epoxy resin.
(3) The epoxy resin according to (2), wherein the aminophenol type epoxy resin is a 4-amino-m-cresol type epoxy resin.
(4) The epoxy resin according to (2), wherein the aminophenol type epoxy resin is a 4-amino-phenol type epoxy resin.

DETAILED DESCRIPTION OF THE INVENTION

The epoxy resin having glycidylamino group in the present invention is an epoxy resin obtained by reacting various kinds of aminophenol with epihalohydrin, and epoxidizing. Concrete examples include an aminophenol type epoxy resin, triglycidyl isocyanurate, tetraglycidyl diaminodiphenylmethane, tetraglycidyl metaxylenediamine, hexaglycidyl triaminobenzene, etc., without being limited thereto.

In the present invention, the aminophenol type epoxy resin is epoxidation product of various kinds of aminophenol by a known method.

Examples of the aminophenol include aminophenols and aminocresols, such as 2-aminophenol, 3-aminophenol, 4-aminophenol, 2-amino-m-cresol, 2-amino-p-cresol, 3-amino-o-cresol, 4-amino-m-cresol, and 6-amino-m-cresol, without being limited thereto.

Suitable viscosity of the epoxy resin having glycidylamino group is depends on the combination with a curing agent and an additive, and not especially limited, but generally it is desirable to be low. That is, when the viscosity of the epoxy resin combined with a curing agent and an additive is high, the coating property and immersing property become inferior and make the working properties bad. Thus the viscosity of the epoxy resin having glycidylamino group is preferably 2000 Pas or less.

In the present invention, the hydrolyzable chlorine means a chlorine contained in:
a group called 1,2-chlorohydrin represented by formula (1),

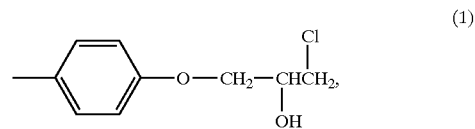

a group called 1,3-chlorohydrin represented by formula (2), or

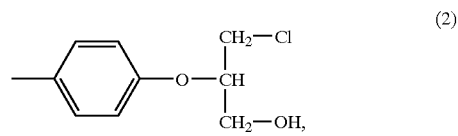

a group called chloromethyl represented by formula (3),

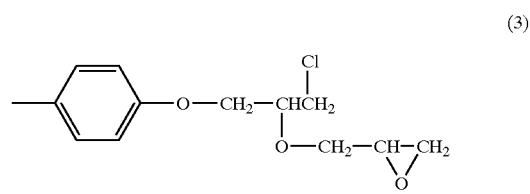

and not limited only to that contained in 1,2-chlorohydrin group.

In the present invention, the content of hydrolyzable chlorine is analyzed by the following method.

That is, about 1 g of a sample is accurately weighed to 1 mg unit in a 100 mL ground glass Erlenmeyer flask. Dioxane 30 mL is added and the sample is dissolved completely using an ultrasonic apparatus. After 5 mL of 1N potassium hydroxide/ethanol solution is added accurately and shaked, boiling tips are put in and a condenser is attached to the flask. It is refluxed on a sand bath with heating at about 180° C. Here the refluxing time is set to be correctly 30 minutes from the start of boiling. After cooling to room temperature, the condenser is washed by methanol 5 mL, and then the washed liquid is added to the sample liquid. The condenser is removed from the Erlenmeyer flask, and the sample liquid is transferred into a 200 mL beaker. Inside of the flask is washed three times with 80% acetone water (total 50 mL), and the washed liquid is added to the sample liquid.

To the sample liquid, N/400 sodium chloride solution 5 mL is added accurately, and a rotor is put in. After adding acetic acid 3 mL and stirring for 2 minutes, potentiometric titration is conducted according to the condition shown by the table 1 below, with using N/100 silver nitrate solution. The same operation as above is performed as a blank test.

TABLE 1

| Device | Potentiometric titration device, (made by Metrom Co., Ltd.) |
| --- | --- |
| Titration range | 750 mV FS |
| Dropping velocity | 10 min/100% vol |
| Auto control | 5 |
| Selector switch | pH, mV |
| Cylinder | 520 mL |

The content of hydrolyzable chlorine is calculated by the following formula.

$$\text{Hydrolyzable chlorine }(\%) = F \times (V-B) \times 0.0355/S$$

In the formula:
F; Factor of the N/100 silver nitrate solution
V; Amount of the N/100 silver nitrate solution used for titration of the sample
B; Amount of the N/100 silver nitrate solution used for titration of blank test
S; Amount of sample (g).

The preparation method of an epoxy resin having glycidylamino group, whose hydrolyzable chlorine content is 1000 ppm or less is not especially limited.

For example, the epoxy resin can be obtained by dechlorination and ring-closure reaction of an epoxy resin having glycidylamino group whose hydrolyzable chlorine content is more than 1000 ppm.

Dechlorination reaction is carried out by dissolving an epoxy resin having glycidylamino group in non-protonic polar solvent, and an alkaline substance is added dropwise and retained with stirring.

As an alkaline substance used for this reaction, sodium hydroxide, potassium hydroxide, calcium hydroxide, etc. are exemplified, and these are used in the form of aqueous solution or alcoholic solution.

The amount of alkaline substance is preferably 0.1 to 10 mol, more preferably 0.5 to 5 mol based on 1 mol of the hydrolyzable chlorine of epoxy resin. When too much amount of alkaline substance is used, polymerization will occur, and when too little, the effect of reduction of hydrolyzable chlorine will become small.

As a non-protonic polar solvent, dimethylsulfoxide, dimethyl sulfone, dimethylacetamide, tetramethylurea, hexamethylphophoramide, etc. are raised, but it is not limited to these.

The amount of non-protonic polar solvent can be used arbitrarily to the amount of epoxy resins, it is suitably 1.0 to 20 times in weight ratio.

Ring-closure reaction is carried out as follows. From the reaction solution obtained above, non-protonic polar solvent contained therein is removed by water-washing or by distillation, and to the solution of the residue whose solvent is replaced with an organic solvent other than non-protonic polar solvent, alkaline substance is added dropwise and stirred, and after the reaction, neutralization is carried out. After then, purification is conducted by partition with water-washing or filtration.

As an alkaline substance used in ring-closure reaction, the same substances used in dechlorination are exemplified.

As organic solvents other than non-protonic polar solvent used in ring-closure reaction, various hydrocarbon solvents and ketone are exemplified, without being limited to these. Among them, ketones such as methylisobutylketone are suitable.

The epoxy resin of the present invention can be used in combination with a curing agent, a curing accelerator, etc. As the curing agent, any curing agent which is usually used as a curing agent for epoxy resins can be used. Examples of the curing agent include dicyandiamide, tetramethylguanidine, polyhydric compounds, acid anhydrides, acid hydrazid compounds, aromatic amines, aliphatic amines and alicyclic amines.

The epoxy resin of the present invention can be used, according to requirements, with adding fillers such as silica, alumina.

Epoxy resin having glycidylamino group with low content of hydrolyzable chlorine of the present invention is useful as electric and electronic materials, such as adhesive, insulating material, and laminated board.

EXAMPLES

Although concrete examples explain the present invention below, the present invention is not limited to these examples.

Viscosity is measured with using a parallel plate type rheometer (CVO Rheometer, produced by Bohlin Co., Ltd.).

Examples 1, 2 and Comparative Example 1
(Preparation of 4-amino-m-cresol Type Epoxy Resin with Low Content of Hydrolyzable Chlorine)

4-amino-m-cresol type epoxy resin having 1450 ppm of hydrolyzable chlorine (comparative example 1, trade name SumiEpoxy ELM-100, Sumitomo Chemical Co.,Ltd.) 60 g was dissolved in dimethylsulfoxide 440 g, and after having replaced the inside of the system with nitrogen, 48% sodium hydroxide aqueous solution 0.35 g (example 1) or 1.27 g (example 2) were added dropwise, respectively, and stirred at 32° C. for 2 hours. After the reaction, neutralization was carried out by adding 0.21 g of phosphoric acid, and 2.4 g of sodium chloride.
(Dechlorination)

Subsequently, dimethyl sulfoxide contained in the above reaction liquid was distilled off under reduced pressure. To residue, methylisobutyl ketone 180 g and 20% hot salt water 80 g were added and partitioned, and then filtrated. The filtrated liquid was washed by hot salt water. (solvent substitution)

Subsequently, 17.2 g of 48% sodium hydroxide aqueous solution was added to the solvent substituted reaction solution, and reaction was carried out at 80° C. for 5 hours.
(Ring-closure reaction)

After the reaction, having added carbon dioxide for neutralization, water content was removed by azeotropic dehydration and inorganic content was removed by filtration.

With increasing charged amount of sodium hydroxide in dechlorination, the reduction of hydrolyzable chlorine was confirmed.

TABLE 2

|  | Example 1 | Example 2 | Comparative example 1 |
| --- | --- | --- | --- |
| Charged amount of 48% NaOH | 0.35 g | 1.27 g | — |
| Hydrolyzable chlorine | 830 ppm | 660 ppm | 1450 ppm |
| Viscosity (25° C.) | 1.7 Pas | 4.0 Pas | 1.1 Pas |

According to the present invention, an epoxy resin having glycidylamino group with low content of hydrolyzable chlorine, which is highly reliable and useful as electric/electronic materials can be provided.

What is claimed is:

1. A 4-amino-m-cresol type epoxy resin having a hydrolyzable chlorine content of 1000 ppm or less, wherein said hydrolyzable chlorine is analyzed by a method in which the epoxy resin is dissolved in dioxane and a potassium hydroxide/alcohol solution is added, and the dioxane solution is refluxed for 30 minutes, and a potentiometric titration is conducted using silver nitrate solution.

2. A curable epoxy composition, comprising:

a curing agent; and an epoxy resin comprising a 4-amino-m-cresol type epoxy resin having a hydrolyzable chlorine content of 1000 ppm or less obtained by a method comprising a dechlorination reaction step wherein a 4-amino-m-cresol type epoxy resin whose hydrolyzable chlorine content is more than 1000 ppm is dissolved in a non-protonic polar solvent, and alkaline substance is added and stirred; and a ring-closure reaction step wherein the non-protonic polar solvent is removed from the above reaction solution by water-washing or by distillation, and to the solution of the residue whose solvent is replaced with an organic solvent other than the protonic polar solvent, alkaline substance is added and stirred; and wherein said hydrolyzable chlorine is analyzed by a method in which the epoxy resin is dissolved in dioxane and a potassium hydroxide/alcohol solution is added, and the dioxane solution is refluxed for 30 minutes, and a potentiometric titration is conducted using silver nitrate solution.

3. A curable epoxy composition according to claim 2, wherein the curing agent comprises dicyandiamide, tetramethylguanidine, a polyhydric compound, and acid anhydride, an acid hydrazid compound, an aromatic amine, an aliphatic amine, or an alicyclic amine.

* * * * *